US008222143B2

(12) United States Patent
Liu et al.

(10) Patent No.: US 8,222,143 B2
(45) Date of Patent: Jul. 17, 2012

(54) REWORKING METHOD FOR INTEGRATED CIRCUIT DEVICES

(75) Inventors: Yan-Home Liu, Hsinchu County (TW);
Yung-Chieh Kuo, Hsin-Chu Hsien (TW); Yi-Ham Tsou, Miaoli County (TW); Jeng-Ho Wang, Hsin-Chu (TW);
Cheng-Wei Chen, Taichung County (TW); Hsin-Yi Lu, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 961 days.

(21) Appl. No.: 11/933,203

(22) Filed: Oct. 31, 2007

(65) Prior Publication Data

US 2009/0111268 A1 Apr. 30, 2009

(51) Int. Cl.
*H01L 21/302* (2006.01)
*B44C 1/22* (2006.01)

(52) U.S. Cl. ............... 438/692; 438/4; 438/689; 216/13; 216/21; 216/58; 216/88

(58) Field of Classification Search ............... 438/4, 689, 438/692; 216/13, 21, 58, 88
See application file for complete search history.

(56) References Cited

U.S. PATENT DOCUMENTS

| 5,926,688 | A  | * | 7/1999  | Lee et al. ................... 438/4 |
| 6,340,601 | B1 | * | 1/2002  | Curran et al. ............... 438/4 |
| 6,746,954 | B2 | * | 6/2004  | Lee ........................ 438/637 |
| 6,767,833 | B2 |   | 7/2004  | Shih et al. |
| 7,662,645 | B2 |   | 2/2010  | Shih |
| 7,820,553 | B2 |   | 10/2010 | Chu |
| 2006/0063373 | A1 | * | 3/2006  | Gambino et al. ........... 438/622 |
| 2006/0223280 | A1 | * | 10/2006 | Ueda ..................... 438/435 |
| 2007/0148956 | A1 | * | 6/2007  | Bae ...................... 438/618 |
| 2007/0249156 | A1 | * | 10/2007 | Bonilla et al. ............. 438/622 |

FOREIGN PATENT DOCUMENTS

| TW | 200705548 | 2/2007 |
| TW | 200921844 | 5/2009 |

* cited by examiner

*Primary Examiner* — Shamim Ahmed
(74) *Attorney, Agent, or Firm* — Winston Hsu; Scott Margo

(57) ABSTRACT

A reworking method for integrated circuit devices includes the following: providing a substrate having a first base layer and a first dielectric layer formed thereon, performing a first dry etching process to remove the first dielectric layer, performing a CMP process to remove the first base layer, and sequentially reforming a second base layer and a second dielectric layer on the substrate. When certain layers on the IC device have hailed an inspection or when quality defects are found, the defective layer is removed according to the provided reworking method.

19 Claims, 16 Drawing Sheets

REWORKING METHOD FOR INTEGRATED CIRCUIT DEVICES

BACKGROUND OF THE INVENTION

1. Field of the Invention

The invention relates to a reworking method for integrated circuit devices, and more particularly, to a reworking method for removing defects on layers of metal interconnections of the integrated circuit devices.

2. Description of the Prior Art

The fabrication procedure of integrated circuit (IC) devices is very complicated. Generally, it requires hundreds of different processes to complete the integrated circuit devices. Whenever the quality requirements of those processes are not being met, a reworking method is thereby needed.

Please refer to FIG. 1, which is a cross-sectional drawing of a conventional metal interconnection. In recent years, integrated circuit devices are formed as a plurality of multi-layered metal interconnections in accordance with a tendency toward higher density and higher integration, and to thereby increase the electrical connections between the metal interconnections themselves or between the integrated circuit devices and the metal interconnections. In a conventional method for fabricating a metal interconnection, a substrate 100 is provided with a base layer 101 and a dielectric layer 102 sequentially formed thereon, and procedures such as the photolithography process and the etching process are performed to form a plurality of vias/trenches for defining the metal interconnection patterns. Then, a barrier layer 104 and a metal layer 106 are sequentially formed in the vias/trenches, and a desired metal interconnection is obtained. As shown in FIG. 1, a base layer 110, a dielectric layer 112, a cap layer 114, and a hard mask layer (not shown) are sequentially deposited on the substrate 100, followed by the performing of procedures such as the photolithograph process and the etching process to form a metal interconnection pattern 116 for preparing another metal interconnection.

Please refer to FIG. 1 again. However, whenever some events such as particle contamination occurring in the above described deposition process, the existence of masking effect resulting from the existence of particles which leads to the forming of incomplete metal interconnection pattern 116 during etching, or having scratches formed on the wafer surface due to any external factor, the wafer thereby cannot be transferred to the next processing step. Thus, a reworking method is needed. Otherwise, the yield of the integrated circuit devices is to by significantly reduced. Sometimes the wafer even has to be discarded as scrape due to serious defects.

SUMMARY OF THE INVENTION

It is therefore a primary objective of the claimed invention to provide a reworking method for integrated circuit devices having defects in the metal interconnection layers for reducing cost associated with the discarding as scrap of the integrated circuit devices.

According to the claimed invention, a reworking method for integrated circuit devices is provided. The method comprises providing a substrate having a first base layer and a first dielectric layer sequentially formed thereon; performing a first dry etching to remove the first dielectric layer; performing a chemical mechanic polish (CMP) process to remove the first base layer; and sequentially reforming a second base layer and a second dielectric layer on the substrate.

According to the claimed invention, another reworking method for integrated circuit devices is provided. The reworking method comprises providing a substrate having a first base layer, a first dielectric layer, and a first cap layer sequentially formed thereon, and at least a metal interconnection pattern is being formed in the first cap layer and the first dielectric layer; performing a first dry etching process to remove the first cap layer; performing a second dry etching process to remove the first dielectric layer; performing a CMP process to remove the first base layer; and reforming a second base layer, a second dielectric layer and a second cap layer sequentially.

According to the reworking method provided by the present invention, when defects are found in the layers of the metal interconnection, or when the metal interconnection pattern has failed the after-etching-inspection (AEI), those undesired layers are effectively removed by the reworking method provided by the present invention. Therefore the corresponding IC devices are prevented from being discarded as scrap, and thus the cost is reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
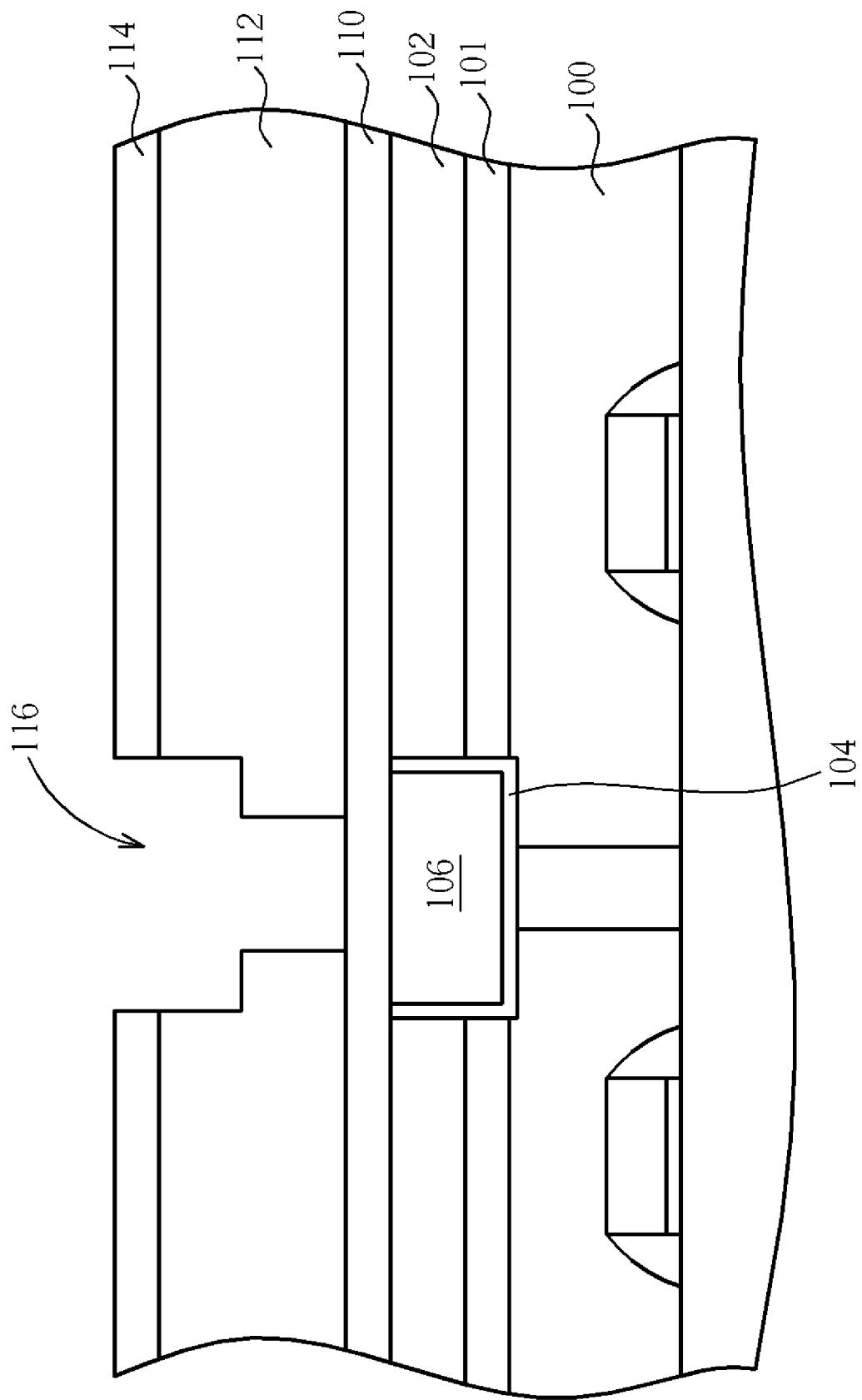
FIG. 1 is a schematic cross-sectional drawing of a conventional metal interconnection.
Figure 2:
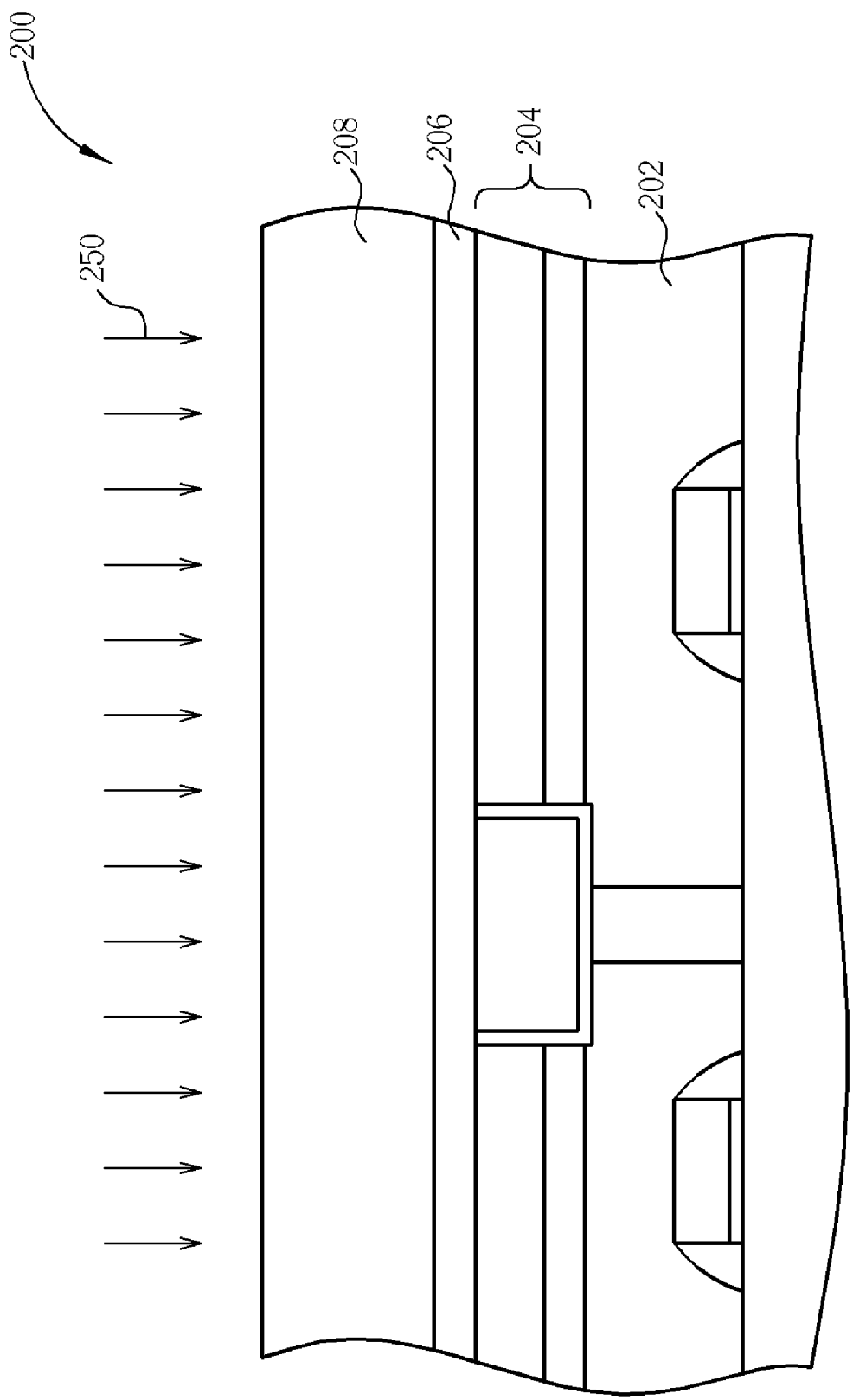
FIGS. 2-6 are schematic drawings illustrating a reworking method for integrated circuit devices according to a first preferred embodiment of the invention.

Please refer to FIGS. 2-6, which are schematic drawings illustrating a reworking method for integrated circuit devices according to a first preferred embodiment of the invention. As shown in FIG. 2, an integrated circuit device 200 having a substrate 202 and at least a metal interconnection layer 204 formed thereon is provided. The substrate 202 also comprises a first base layer 206 and a first dielectric layer 208 sequentially formed thereon. The first base layer 206 can comprise silicon nitride (SiN); and the first dielectric layer 208 can comprise fluoride silicon glass (FSG).

Figure 3:
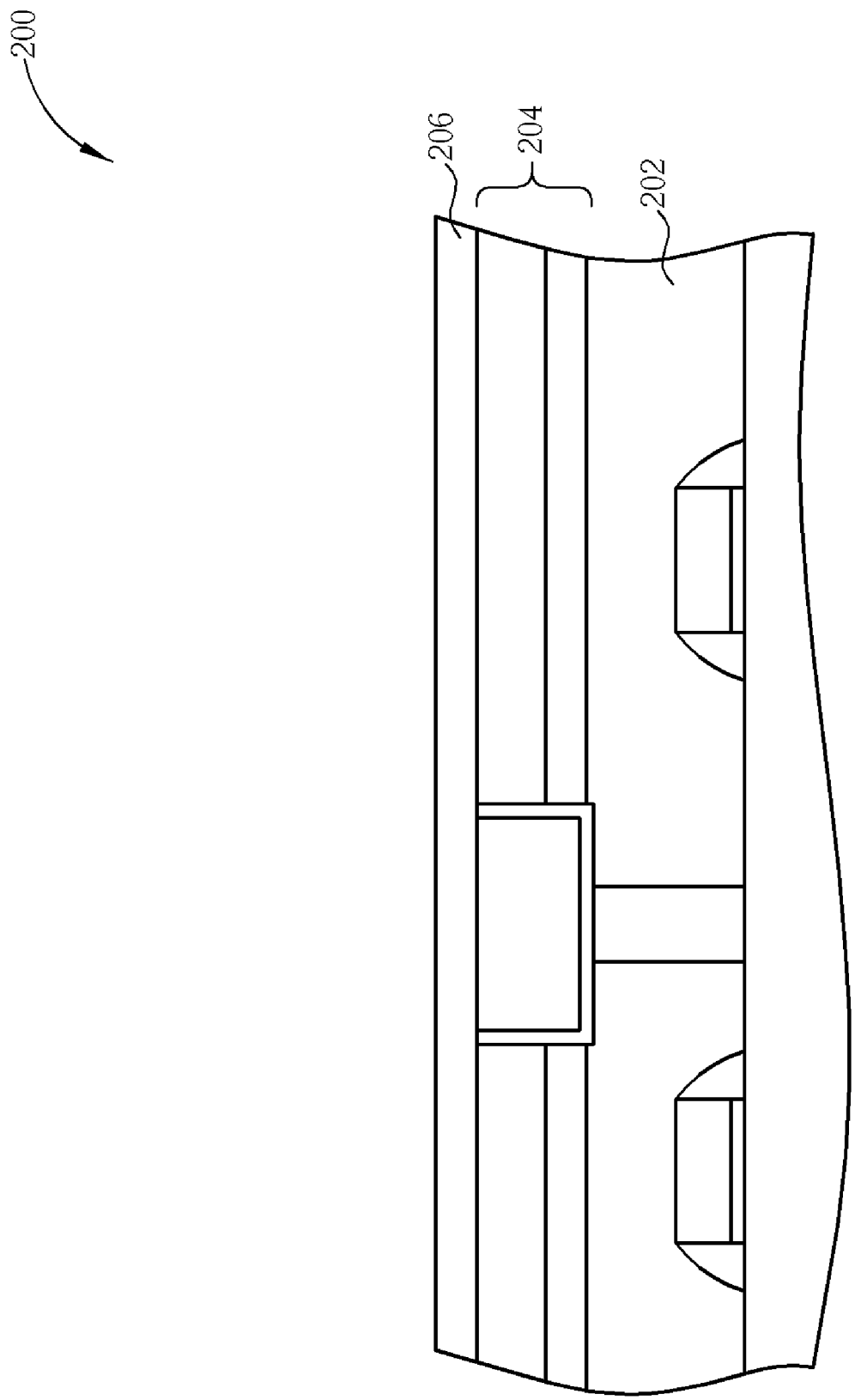

Please refer to FIGS. 2-3. When the integrated circuit device 200 has failed an after-deposition-inspection, a dry etching process 250 is performed to remove the first dielectric layer 208. It is noteworthy that the dry etching process 250 is performed having a high selectivity between the first dielectric layer 208 and the first base layer 206. For example, oxygen and fluorocarbon, such as octafluorocyclopentene ($C_5F_8$), with a preferred ratio of 2:3 can be introduced into the dry etching process 250 for serving as the reaction gases. The dry etching process 250 utilizing the above-mentioned reaction gases has an etching rate for the first dielectric layer 208 comprising of FSG of 65 A/sec and an etching rate for the first base layer 206 which comprises SiN of 4 A/sec.

Figure 4:
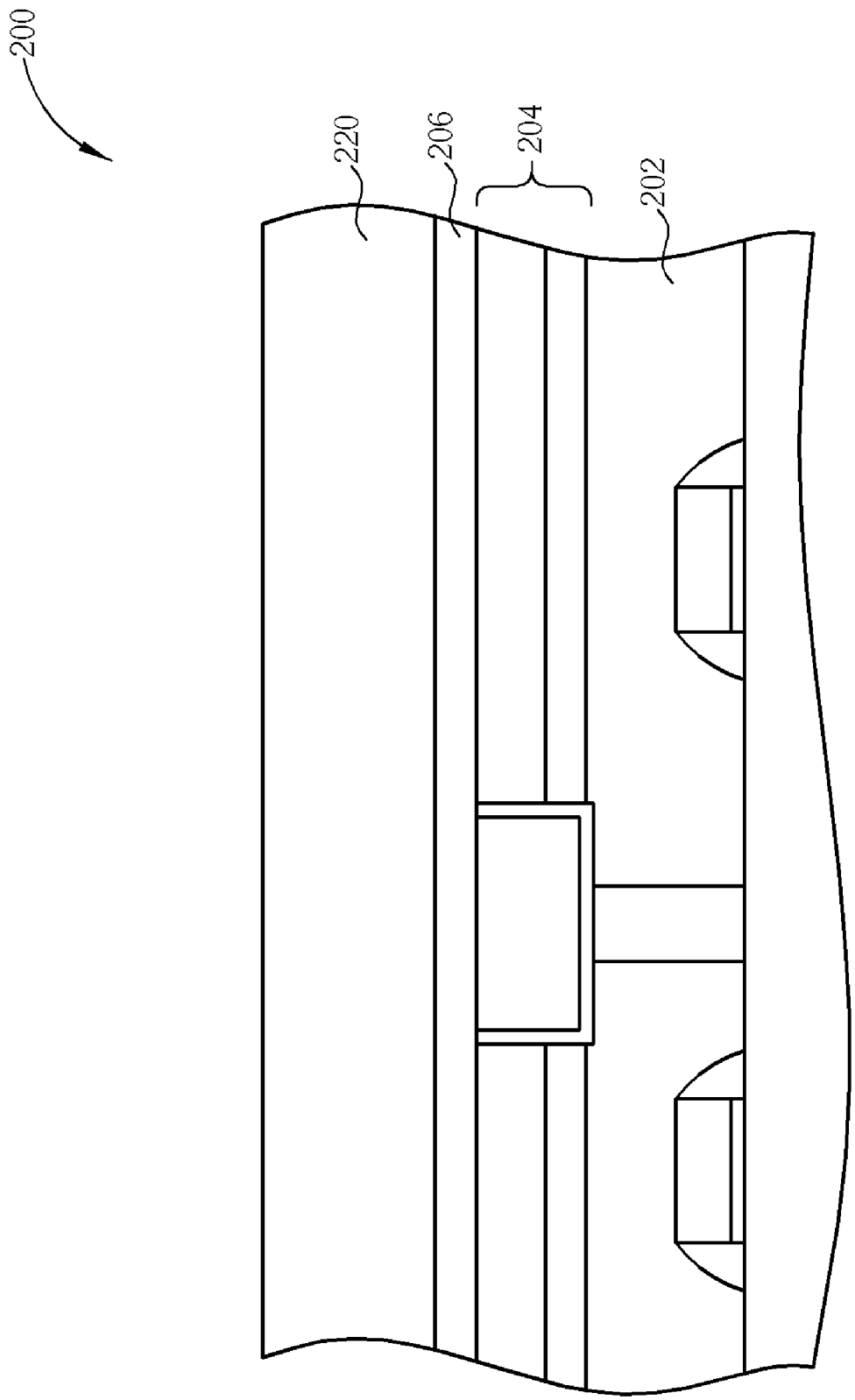

Please refer to FIG. 4. After the first dielectric layer 208 is removed, a second dielectric layer 220 is reformed on the first base layer 206 as shown in FIG. 4. The second dielectric layer 220, which is similar to the first dielectric layer 208, can comprise FSG. And both of the first dielectric layer 208 and the second dielectric layer 220 serve as the inter metal dielectric (IMD) layers.

Figure 5:
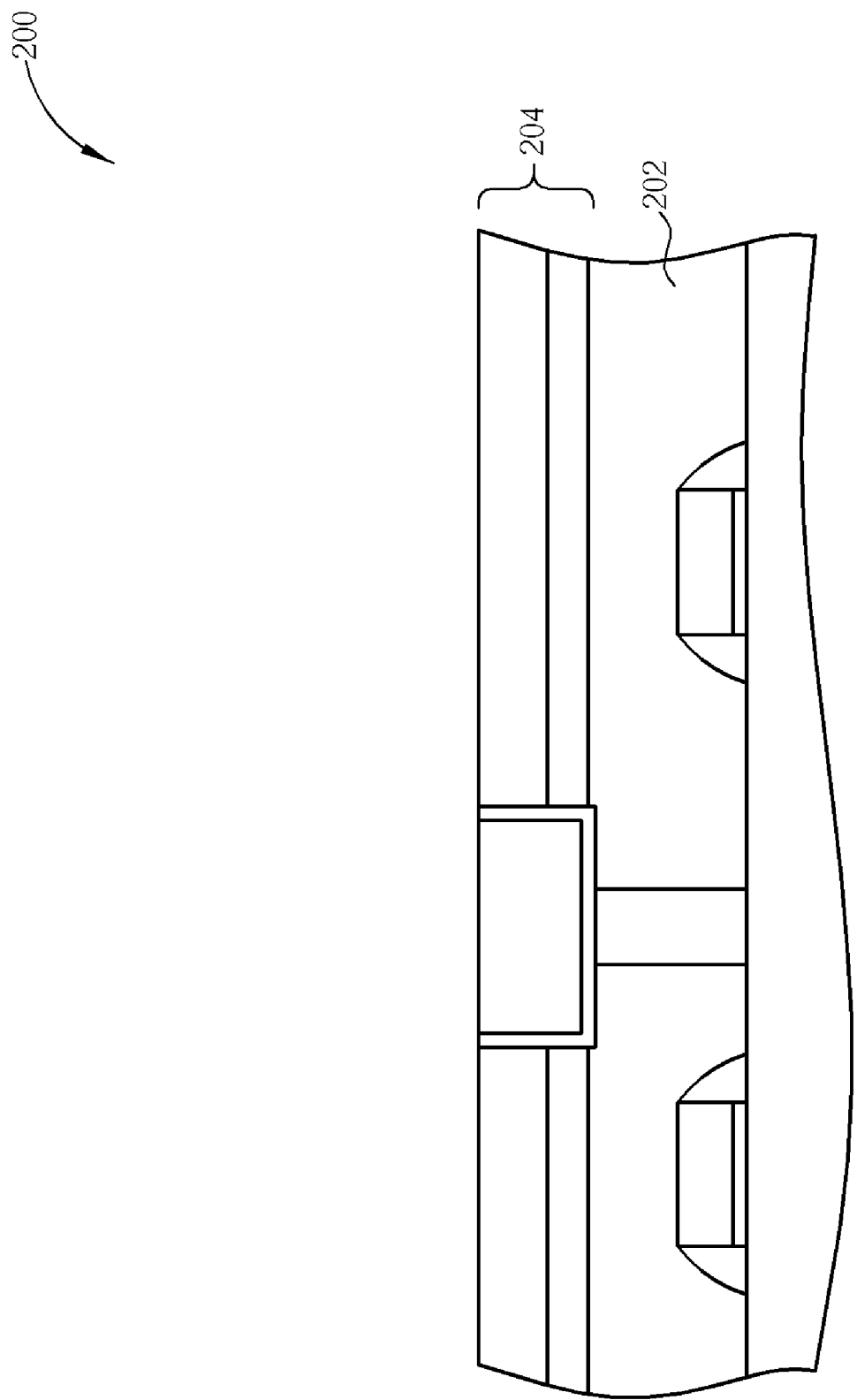
Figure 6:
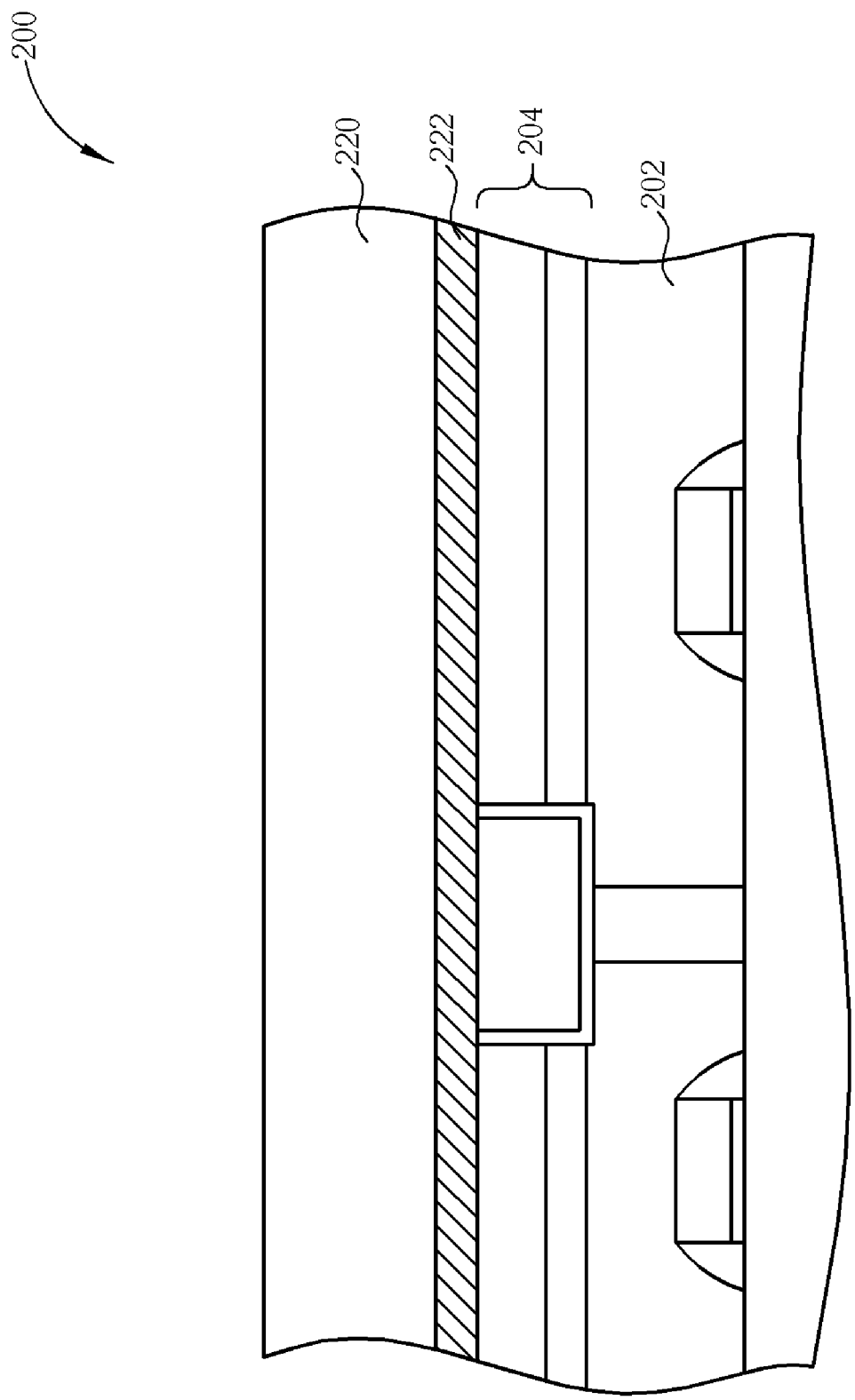

Please refer to FIGS. 3 and 5. After the dry etching process 250 is performed for removing the first dielectric layer 208, a chemical mechanic polish (CMP) process can be performed to remove the first base layer 206. Due to the high selectivity between the first dielectric layer 208 and the first base layer 206 as found in the dry etching process 250, even if the first base layer 206 is slightly consumed in the dry etching process 250, the uniformity of the first base layer 206 would not be overly negatively affected. Thus the first base layer 206 can be removed by the CMP process. Please refer to FIG. 6. When the layers which have failed in the after-deposition-inspection are removed, a second base layer 222 is reformed on the substrate 202. The second base layer 222, similar to the first base layer 206, can comprise SiN. Then a second dielectric layer 220 is reformed on the second base layer 222.

Figure 7:
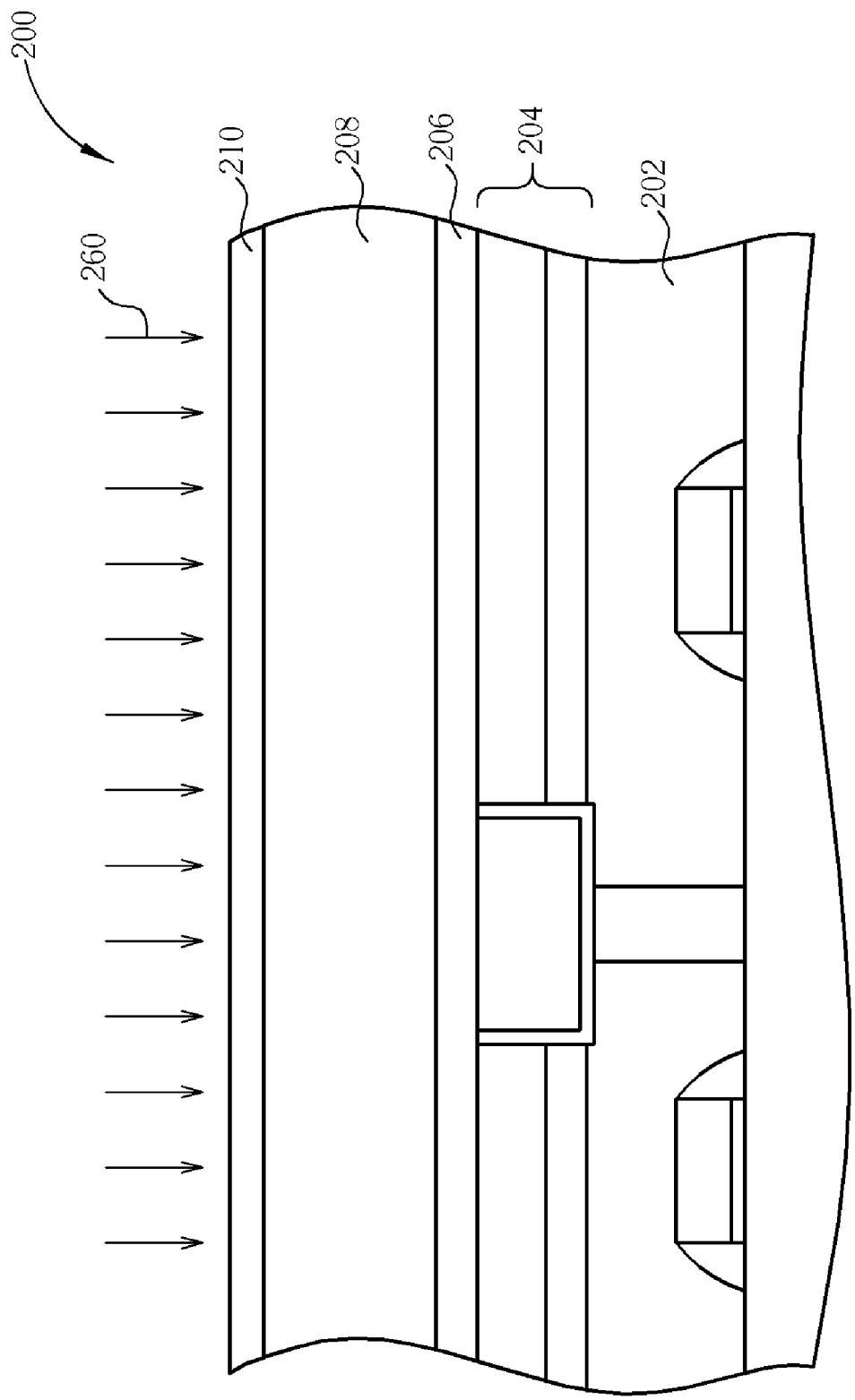
FIGS. 7-10 are schematic drawings illustrating a reworking method for integrated circuit devices according to a second preferred embodiment of the invention.

Please refer to FIGS. 7-10, which are schematic drawings illustrating a reworking method for integrated circuit devices according to a second preferred embodiment of the invention. As shown in FIG. 7, an integrated circuit device 200 having a substrate 202 and at least a metal interconnection 204 layer formed thereon is provided. The substrate 202 also comprises a first base layer 206, a first dielectric layer 208, and a first cap layer 210 sequentially formed thereon. The first base layer 206 can comprise SiN; the first dielectric layer 208 can comprise FSG; and the first cap layer 210 can comprise silicon oxynitride (SiON).

Figure 8:
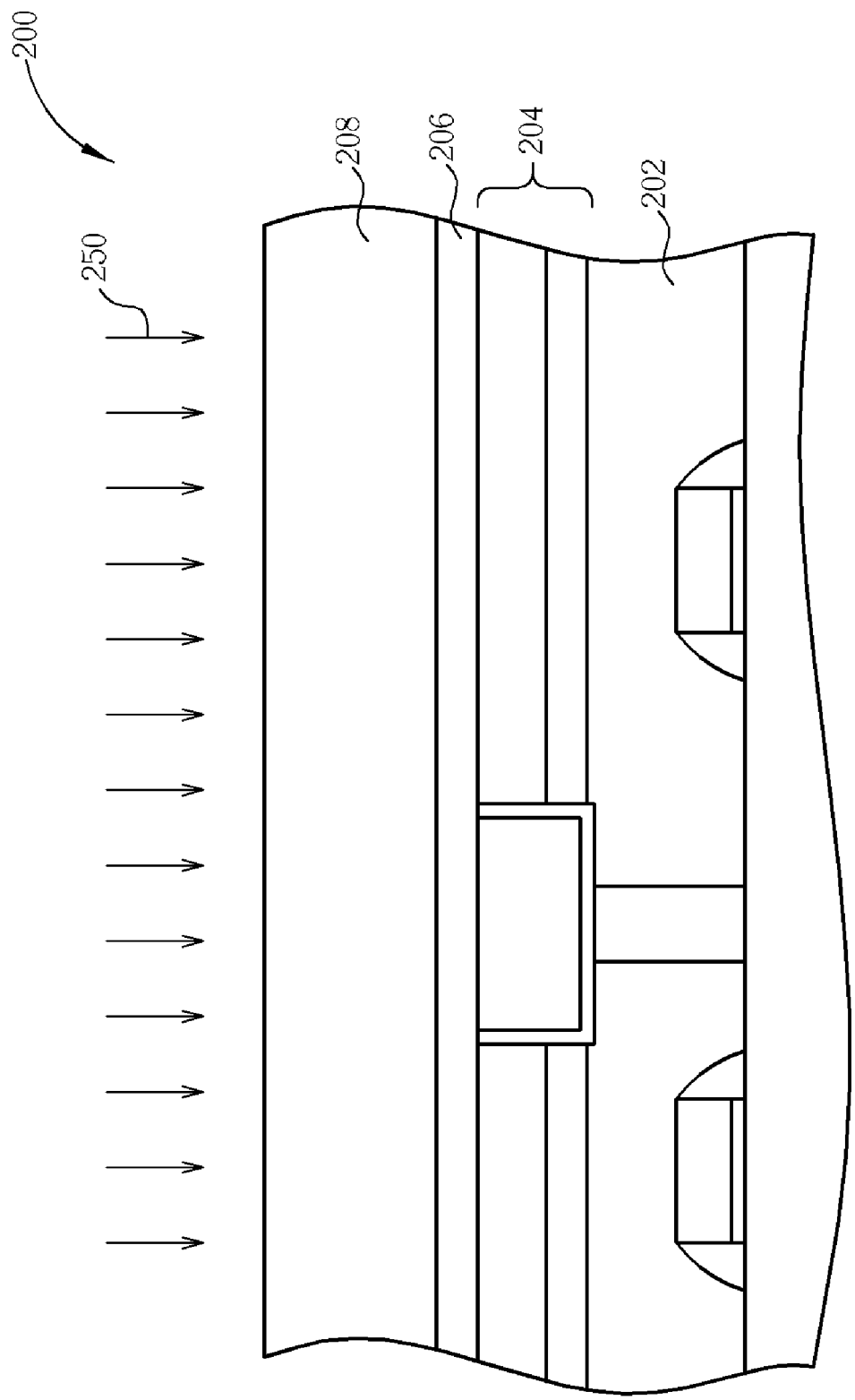

Please refer to FIGS. 7-8. When the integrated circuit device 200 has failed an after-deposition-inspection, a dry etching process 260 is performed to remove the first cap layer 210. After removing the first cap layer 210, another dry etching process 250 is performed to remove the first dielectric layer 208. It is noteworthy that the dry etching process 250 is performed having a high selectivity between the first dielectric layer 208 and the first base layer 206. For example, oxygen and fluorocarbon such as $C_5F_8$ with a preferred ratio of 2:3 can be introduced in the dry etching process 250 for serving as the reaction gases. The dry etching process 250 utilizing the above-mentioned reaction gases has an etching rate for the first dielectric layer 208 which comprises FSG of 65 A/sec, and an etching rate for the first base layer 206 which comprises SiN of 4 A/sec.

Figure 9:
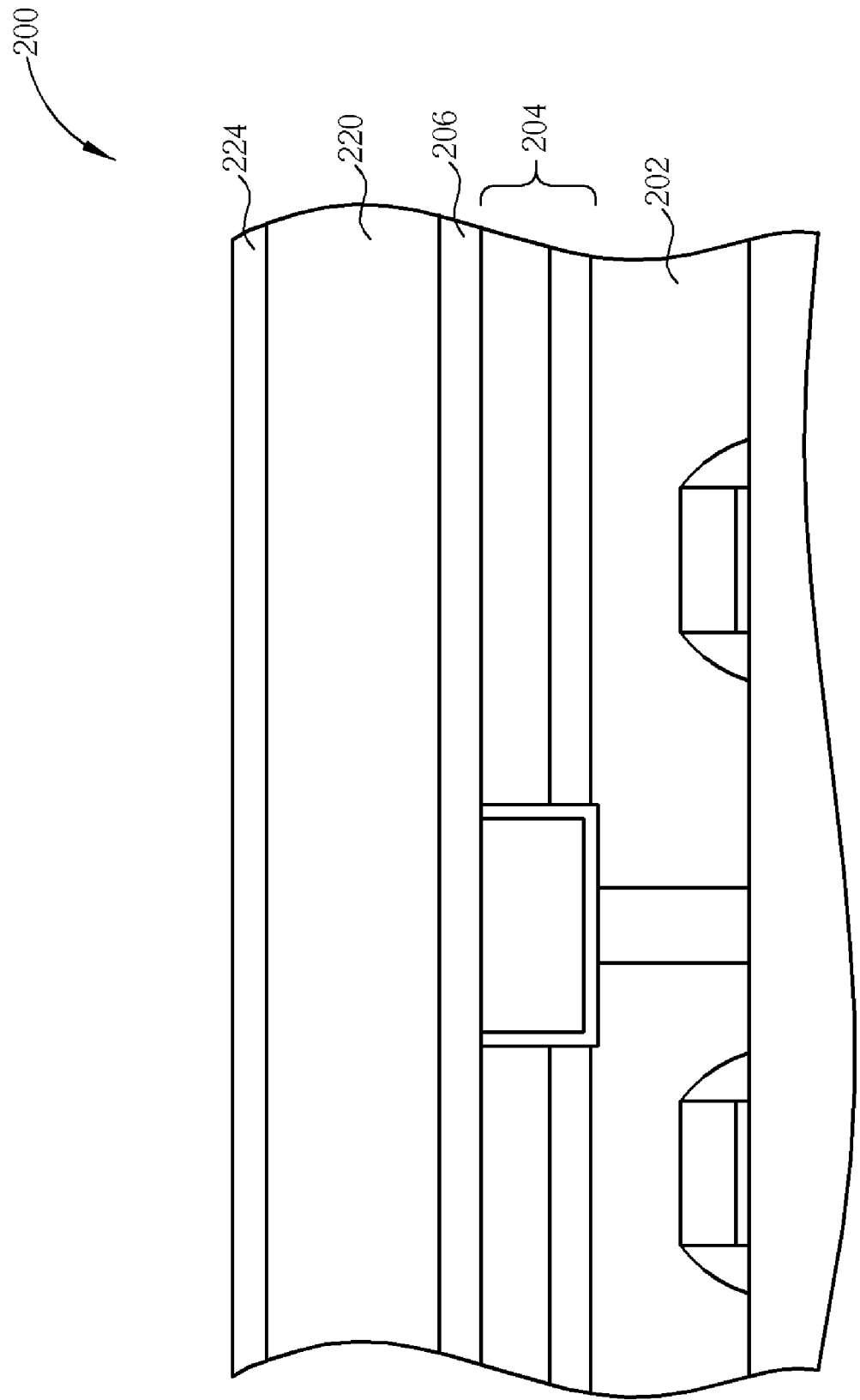
Figure 10:
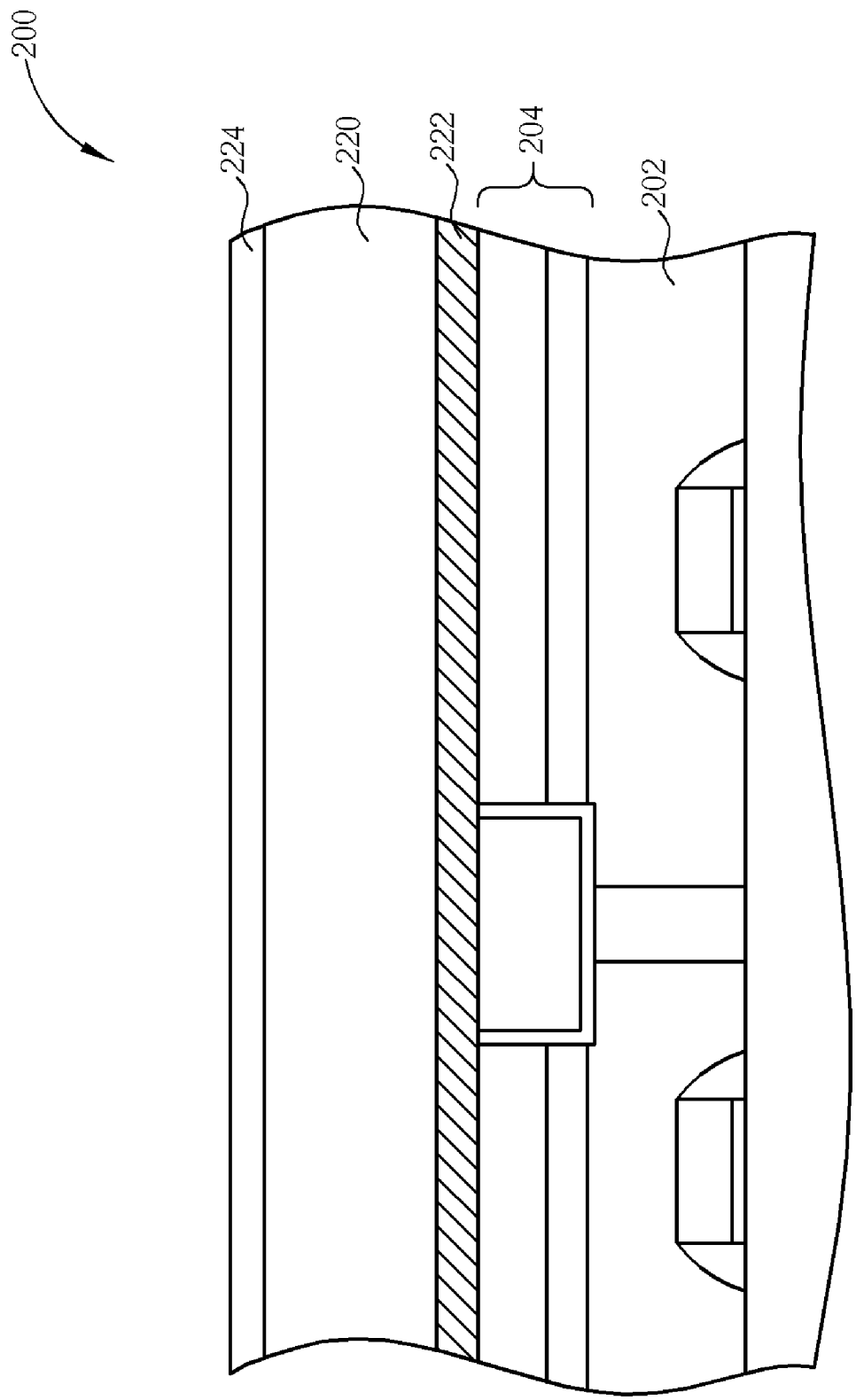

Please refer to FIG. 9. After the first cap layer 210 and the first dielectric layer 208 are removed, a second dielectric layer 220 and a second cap layer 224 are sequentially reformed on the first base layer 206 as shown in FIG. 9. The second dielectric layer 220, which is similar to the first dielectric layer 208, can comprise FSG. And both of the first dielectric layer 208 and the second dielectric layer 220 serve as IMD layers. The second cap layer 224 can comprise SiON, similar as the first cap layer 210.

Moreover, after the first dielectric layer 208 is removed by the dry etching process 250, a CMP process can be performed to remove the first base layer 206. Since the CMP result is similar with that shown in FIG. 5, thereby additional drawings are omitted in the interest of brevity. Due to the high selectivity between the first dielectric layer 208 and the first base layer 206 as found in the dry etching process 250, even if the first base layer 206 is slightly consumed in the dry etching process 250, the uniformity of the first base layer 206 would not be overly negatively affected. Thus the first base layer 206 can be removed by the CMP process. Please refer to FIG. 10. When the layers which have failed the after-deposition-inspection are removed, a second base layer 222, a second dielectric layer 220, and a second cap layer 224 are sequentially reformed on the substrate 202. The second base layer 222, similar to the first base layer 206, can comprise SiN.

According to the first and second preferred embodiments of by the present invention, when the layers, such as the first base layer 206, the first dielectric layer 208, or the first cap layer 208 of the integrated circuit device 200 has failed the after-deposition-inspection, or is scrapped or damaged by other factors, the reworking method provided by the present invention is performed to remove the undesired layers, thereby preventing the integrated circuit device 200 from being discarded as scrap and cost is reduced.

Figure 11:
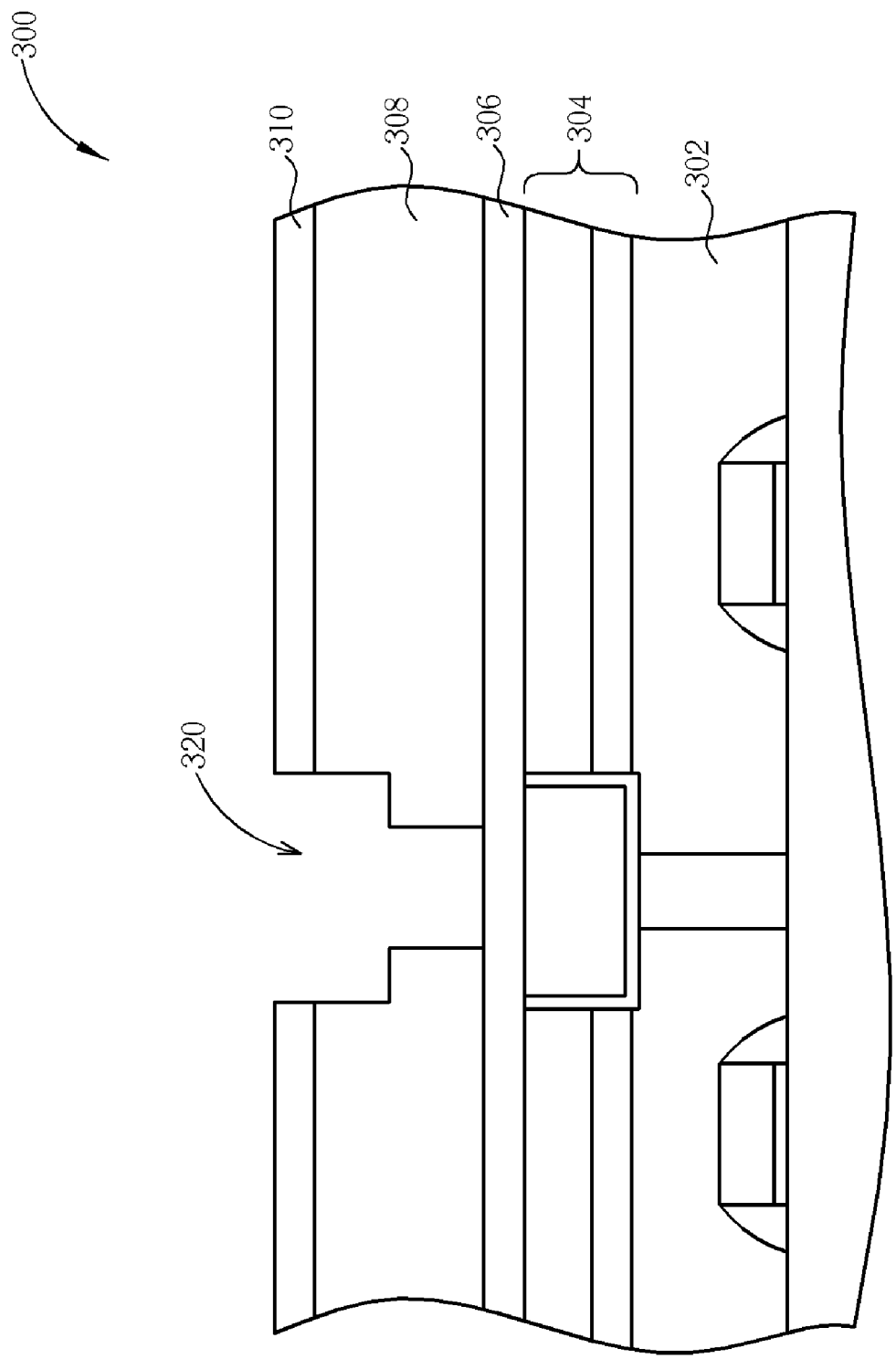
FIGS. 11-16 are schematic drawings illustrating a reworking method for integrated circuit devices according to a third preferred embodiment of the invention.

Please refer to FIGS. 11-16, which are schematic drawings illustrating a reworking method for integrated circuit devices according to a third preferred embodiment of the invention. As shown in FIG. 11, an integrated circuit device 300 having a substrate 302 and at least a metal interconnection layer 304 formed thereon is provided. The substrate 302 also comprises a first base layer 306, a first dielectric layer 308 serving as IMD, and a first cap layer 310 sequentially formed thereon. As mentioned above, the first base layer 306 can comprise SiN, the first dielectric layer 308 can comprise FSG, and the first cap layer 310 can comprise SiON. In addition, a metal interconnection pattern 320 is formed in the first cap layer 310 and the first dielectric layer 308 by procedures such as the photolithograph process and the etching process. As shown in FIG. 11, the first base layer 306 is exposed at the bottom of the metal interconnection pattern 320.

Figure 12:
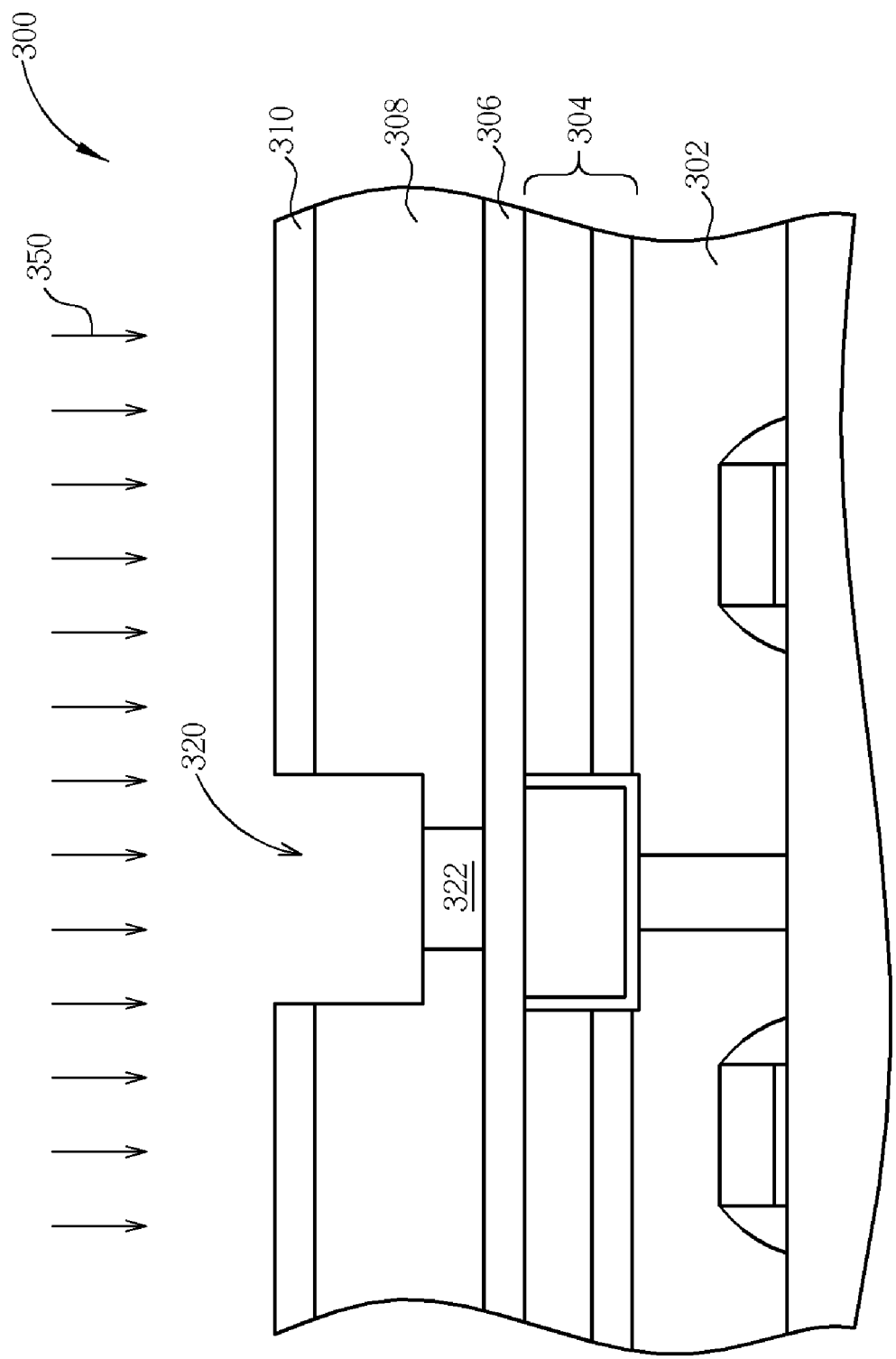

Please refer to FIG. 12. When the integrated circuit device 300 has failed an after-etching-inspection (AEI), a reworking method provided by the present invention is performed. First, a protecting layer 322 is formed on the first cap layer 310. The protecting layer 322 can be a photoresist, and is to be formed on the first cap layer 310 by a spin on coating method. Then an etching back process is performed to etch back the protecting layer 322 to be below an opening of the metal interconnection pattern 320.

Figure 13:
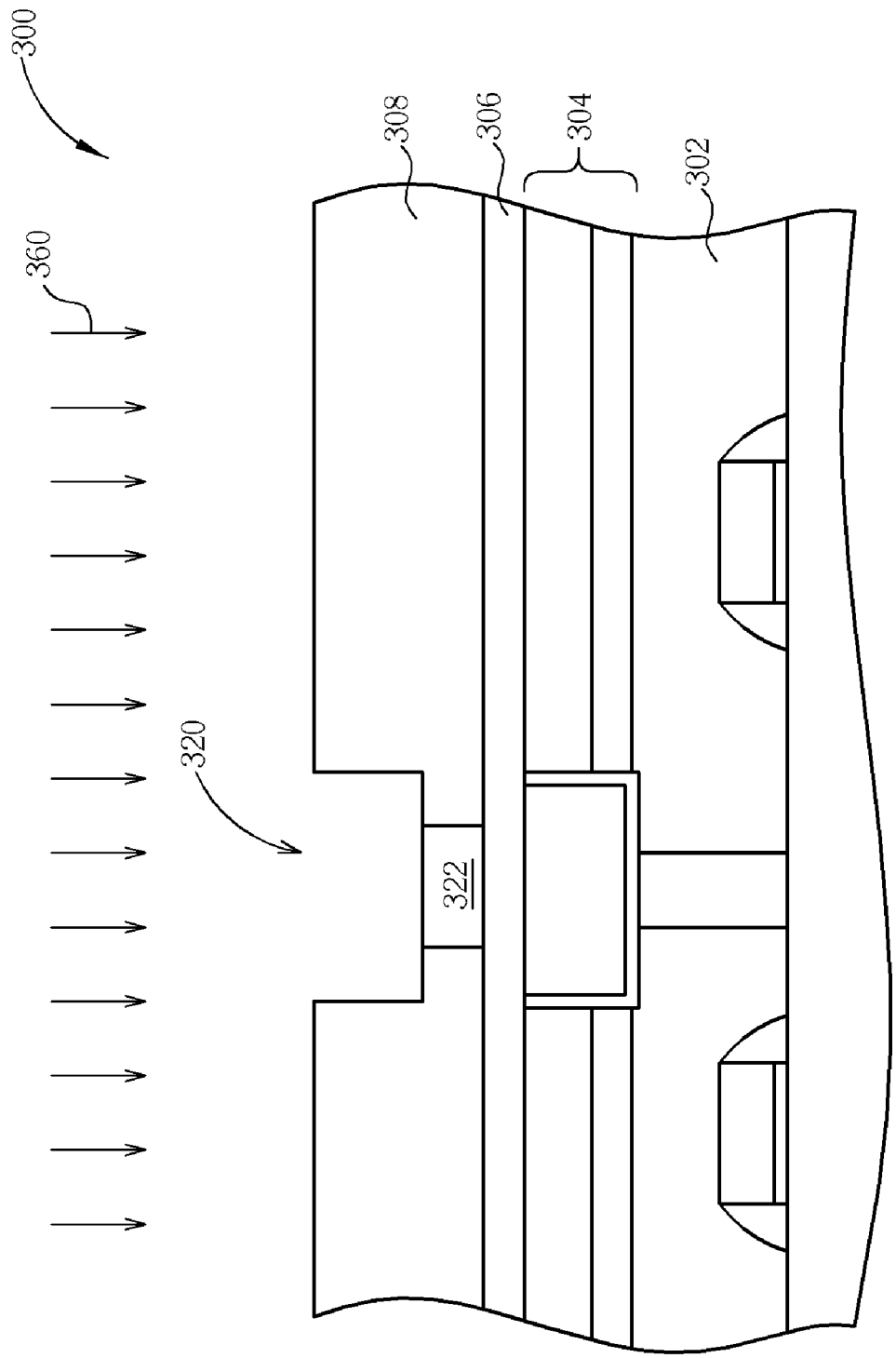

Please refer to FIGS. 12-13, when a dry etching process 350 is performed to remove the first cap layer 310. The dry etching process 350 is performed having a high selectivity between the first cap layer 310 and the protecting layer 322. For example, Oxygen, fluoroform ($CH_3F$), and nitrogen with a preferred ratio of 1:12:24 can be introduced into the dry etching process 350 for serving as the reaction gases. The dry etching process utilizing the above-mentioned reaction gases has an etching rate for the first cap layer 310 which comprises SiON of 45 A/sec, and an etching rate for the protecting layer 322 which comprises photoresist of 0 A/sec.

It is noteworthy that the reaction gases used to etch SiON are capable of etching SiN. For example, the reaction gases comprising oxygen, $CH_3F$, and nitrogen have an etching rate of 35 A/sec for SiN. Therefore the first base layer 306 is also etched during the dry etching process 350. In an undesirable scenario, the first base layer 306 is consumed to the point of exposing the copper wire underneath. However, according to the third preferred embodiment, the dry etching process 320 has a very low etching rate for the protecting layer 322, which is formed in the metal interconnection pattern 320; therefore, the protecting layer 322 protects the first base layer 306 from coming into contact with the reaction gases of the dry etching process 350 and prevents the first base layer 306 from being etched. Consequently, the copper wire underneath the first base layer 306 is protected. Furthermore, since the protecting layer 322 is etched back to be below the opening of the metal interconnection pattern 320, there would be no remnants of the protecting layer 322 to be remained on the first cap layer 310; therefore, the dry etching process 350 is able to remove the first cap layer 310 completely.

Figure 14:
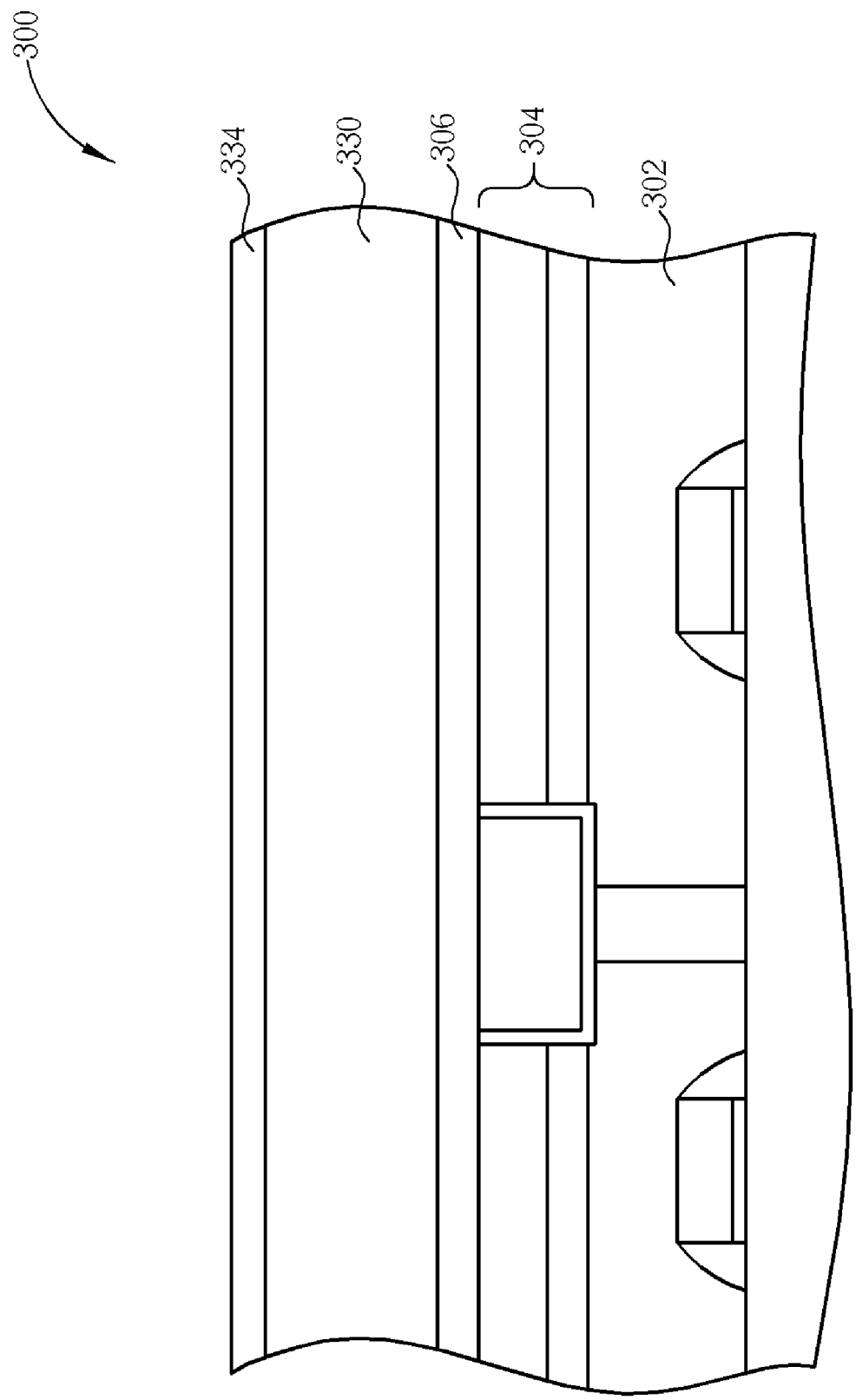

Please refer to FIGS. 13-14. After removing the first cap layer 310, another dry etching process 360 is performed to remove the first dielectric layer 308. And a second dielectric layer 330 and a second cap layer 334 are sequentially reformed on the first base layer 306 after removing the protecting layer 322 in order to prepare for the forming of a metal interconnection pattern again as shown in FIG. 14. The second dielectric layer 330 can comprise FSG, and to serve as IMD layer as the first dielectric layer 308 does. The second cap layer 334, which is similar to the first cap layer 310, can comprise SiON.

The dry etching process 360 is performed having a high selectivity between the first dielectric layer 308 and the first base layer 306. For example, oxygen and fluorocarbon such as $C_5F_8$ with a preferred ratio of 2:3 can be introduced into the dry etching process 360 for serving as the reaction gases. The dry etching process 360 utilizing the above-mentioned reaction gases has an etching rate for the first dielectric layer 308 which comprises FSG of 65 A/sec, and an etching rate for the first base layer 306 which comprises SiN of 4 A/sec.

Figure 15:
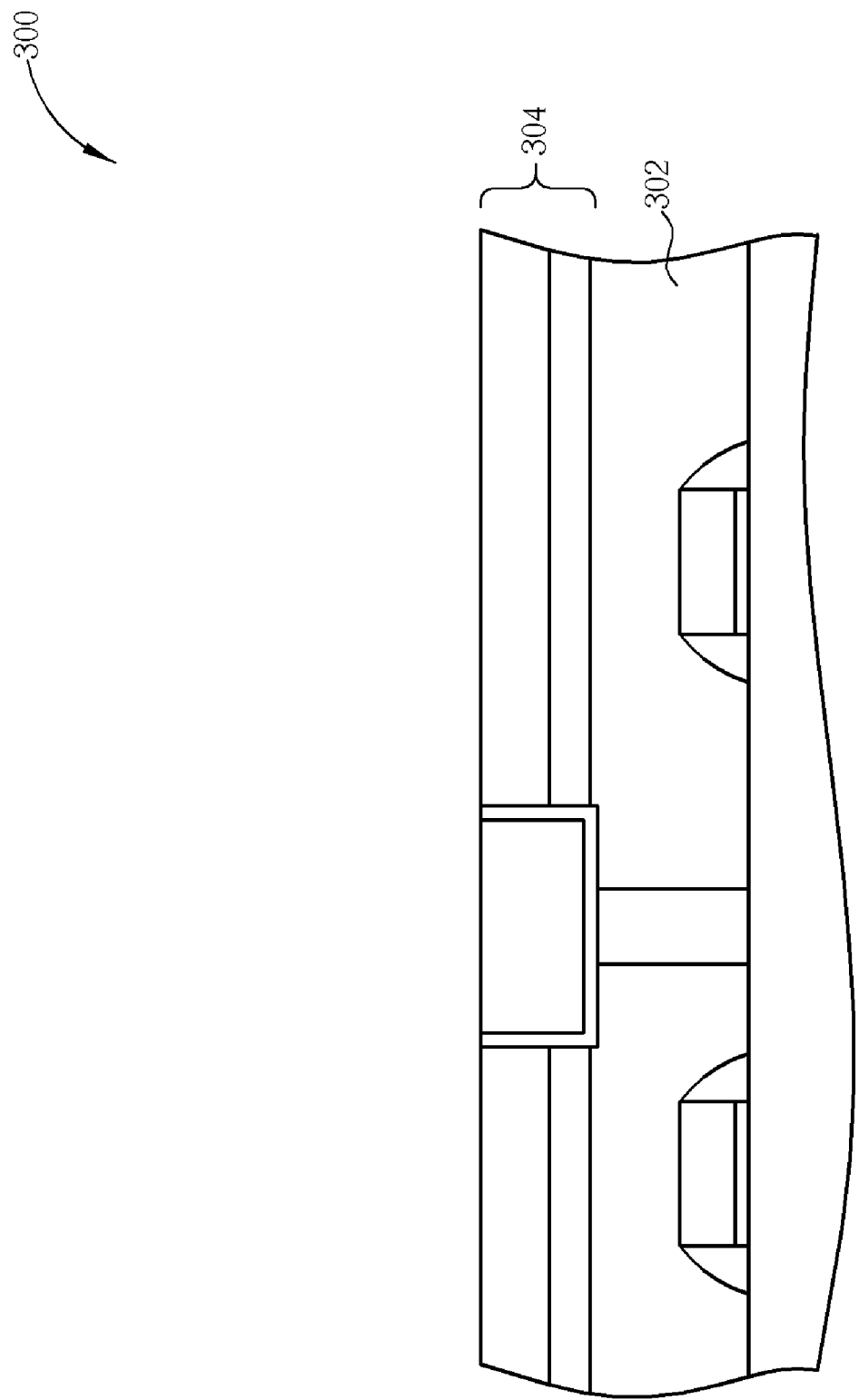
Figure 16:
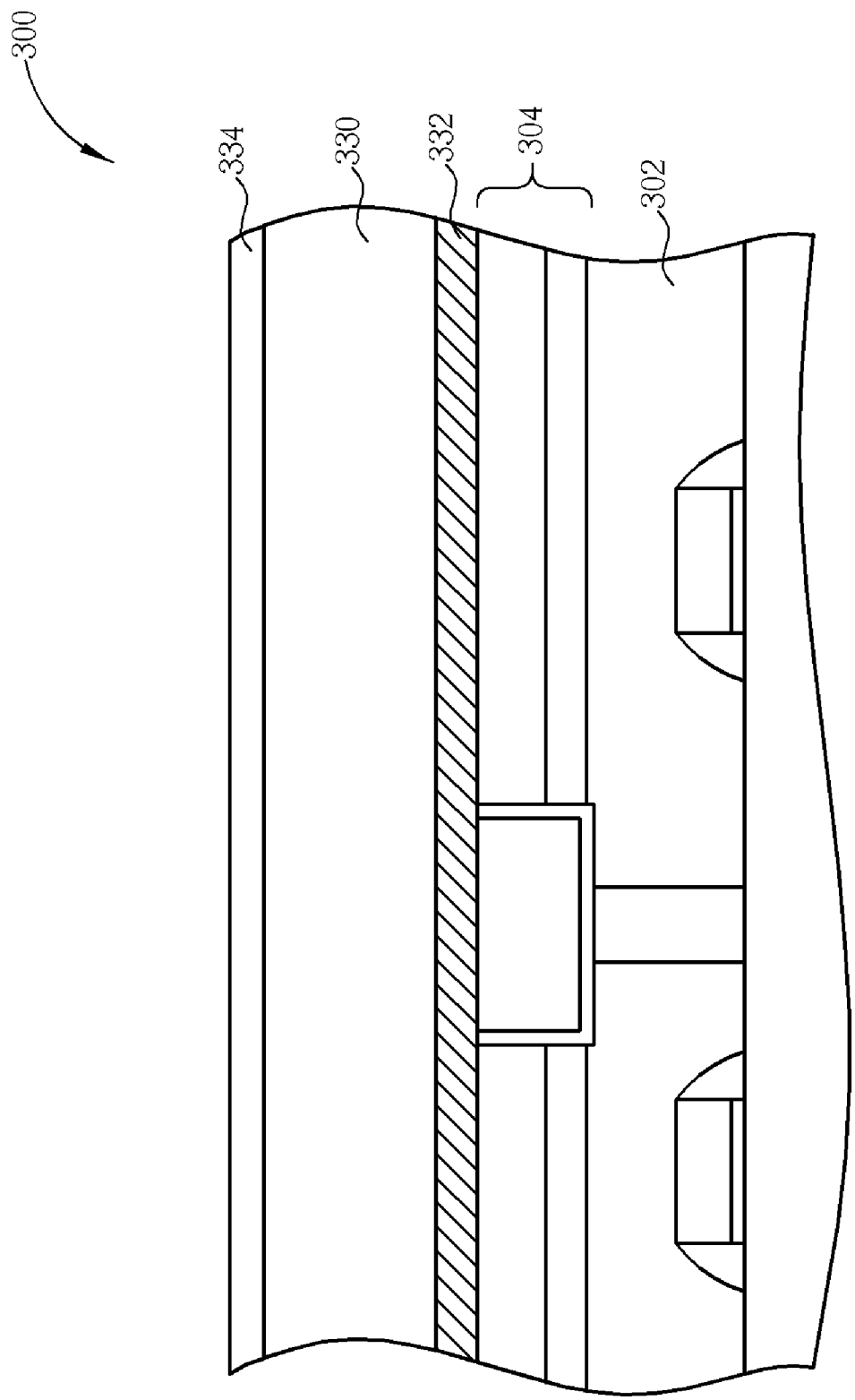

Furthermore, as shown in FIG. 15, after the first dielectric layer 308 is removed by using the dry etching process 360, a CMP process is performed to remove the first base layer 306. Due to the high selectivity between the first dielectric layer 308 and the first base layer 306 as found in the dry etching process 360, even if the first base layer 306 is slightly consumed during the dry etching process 360, the uniformity of the first base layer 306 would not be overly negatively affected. Thus the first base layer 306 can be removed by the CMP process. Please refer to FIG. 16. When the layers which have failed the AEI are removed, a second base layer 332, a second dielectric layer 330, and a second cap layer 334 are sequentially reformed on the substrate 302. The second base layer 306, similar to the first base layer 306, can comprise SiN. Thus the reworked integrated circuit device 300 is prepared for forming a metal interconnection pattern again.

According to the third preferred embodiments of the present invention, when the metal interconnection pattern 320 has failed the AEI due to the masking effect by the particles or due to any other factors, the reworking method provided by the present invention is performed to remove the undesired layers; therefore, the integrated circuit device 300 is prevented from being discarded as scrap, and cost is reduced.

As mentioned above, the reworking method provided by the present invention can be used for removing any of the undesired layers, such as the base layer, the dielectric layer, or the cap layer on the integrated circuit device when it failed in the after-deposition-inspection or is damaged by other factors. The reworking method also can be applied to integrated circuit device having metal interconnection pattern upon failures in AEI or is damaged by other factors for removing the undesired layers. The integrated circuit devices undergoing the reworking method provided by the present invention are used for reforming layers of the metal interconnection or reforming metal interconnection patterns. Therefore, the integrated circuit device is prevented from being discarded as scrap, and the cost is reduced.

Those skilled in the art will readily observe that numerous modifications and alterations of the device and method may be made while retaining the teachings of the invention.

What is claimed is:

1. A reworking method for integrated circuit devices, comprising:
   providing a substrate having a first base layer and a first dielectric layer sequentially formed thereon and a metal structure formed below the first base layer;
   performing a first dry etching to remove the first dielectric layer, and the metal structure being still covered by the first base layer ;
   performing a chemical mechanic polish (CMP) process to remove the first base layer to expose the metal structure; and
   sequentially reforming a second base layer and a second dielectric layer on the substrate.

2. The reworking method of claim 1, wherein the first dielectric layer and the second dielectric layer serve as inter metal dielectric (IMD) layers.

3. The reworking method of claim 1, wherein the first dielectric layer and the second dielectric layer comprise fluoride silicon glass (FSG).

4. The reworking method of claim 1, wherein the first base layer and the second base layer comprise silicon nitride (SiN).

5. The reworking method of claim 1, wherein the first dry etching is performed having a high selectivity between the first dielectric layer and the first base layer.

6. The reworking method of claim 1, wherein the substrate further comprises a first cap layer.

7. The reworking method of claim 6, further comprising performing a second dry etching process to remove the first cap layer before the first dry etching process.

8. The reworking method of claim 7, further comprising reforming a second cap layer on the second dielectric layer after reforming the second dielectric layer.

9. The reworking method of claim 8, wherein the first cap layer and the second cap layer comprise silicon oxynitride (SiON).

10. The reworking method of claim 1, wherein the metal structure further comprises at least a metal interconnection layer.

11. A reworking method for integrated circuit devices, comprising:
    providing a substrate having a first base layer, a first dielectric layer, and a first cap layer sequentially formed thereon, and at least an opening pattern for forming a metal interconnection being formed in the first cap layer and the first dielectric layer;
    performing a first dry etching process to remove the first cap layer;
    performing a second dry etching process to remove the first dielectric layer after the first dry etching process;
    performing a CMP process to remove the first base layer after the second dry etching process; and
    sequentially reforming a second base layer, a second dielectric layer, and a second cap layer on the substrate.

12. The reworking method of claim 11, wherein the first dielectric layer and the second dielectric layer serve as IMD layers and comprise FSG.

13. The reworking method of claim 11, wherein the first cap layer and the second cap layer comprise SiON.

14. The reworking method of claim 11, wherein the first base layer is exposed at a bottom of the opening pattern.

15. The reworking method of claim 14, further comprising forming a protecting layer in the opening pattern before the first dry etching process.

16. The reworking method of claim 15, further comprising performing an etching back process to etch back the protecting layer to be below an opening of the opening pattern.

17. The reworking method of claim 15, wherein the first dry etching process is performed having a high selectivity between the first cap layer and the protecting layer.

18. The reworking method of claim 11, wherein the first base layer and the second base layer comprise SiN.

19. The reworking method of claim 11, wherein the second dry etching process is performed having a high selectivity between the first dielectric layer and the first base layer.

* * * * *